(12) United States Patent
Yang et al.

(10) Patent No.: US 10,930,721 B2
(45) Date of Patent: Feb. 23, 2021

(54) ORGANIC LIGHT EMITTING DISPLAY DEVICE AND METHOD OF MANUFACTURING ORGANIC LIGHT EMITTING DISPLAY DEVICE

(71) Applicant: Samsung Display Co., LTD., Yongin-si (KR)

(72) Inventors: Shin-Hyuk Yang, Seongnam-si (KR); Kwang-Soo Lee, Gwangmyeong-si (KR); Doo-Hyun Kim, Goyang-si (KR); Jee-Hoon Kim, Cheonan-si (KR)

(73) Assignee: Samsung Display Co., Ltd.

( * ) Notice: Subject to any disclaimer, the term of this patent is extended or adjusted under 35 U.S.C. 154(b) by 0 days.

(21) Appl. No.: 15/453,513

(22) Filed: Mar. 8, 2017

(65) Prior Publication Data

US 2017/0301743 A1  Oct. 19, 2017

(30) Foreign Application Priority Data

Apr. 19, 2016 (KR) ........................ 10-2016-0047857

(51) Int. Cl.
*H01L 27/32* (2006.01)
*H01L 27/12* (2006.01)
(Continued)

(52) U.S. Cl.
CPC ........ *H01L 27/3262* (2013.01); *H01L 21/469* (2013.01); *H01L 21/477* (2013.01);
(Continued)

(58) Field of Classification Search
None
See application file for complete search history.

(56) References Cited

U.S. PATENT DOCUMENTS

2010/0140613 A1* 6/2010 Kimura ............... H01L 27/1225
257/43
2012/0001167 A1* 1/2012 Morosawa .......... H01L 29/7869
257/43
(Continued)

FOREIGN PATENT DOCUMENTS

KR    10-2012-0081425 A    7/2012

OTHER PUBLICATIONS

Definition of "integral" from Merriam-Webster.com, available at https://www.merriam-webster.com/dictionary/integral (Year: 2018).*
(Continued)

*Primary Examiner* — Erik Kielin
(74) *Attorney, Agent, or Firm* — Innovation Counsel LLP

(57) ABSTRACT

An organic light emitting display device includes a substrate, a buffer layer, an active layer, a gate insulation layer, a protective insulating layer, a gate electrode, an insulating interlayer, source and drain electrodes, and a sub-pixel structure. The buffer layer is disposed on the substrate. The active layer is disposed on the buffer layer, and has a source region, a drain region, and a channel region. The gate insulation layer is disposed in the channel region on the active layer. The protective insulating layer is disposed on the buffer layer, the source and drain regions of the active layer, and the gate insulation layer. The gate electrode is disposed in the channel region on the protective insulating layer. The insulating interlayer is disposed on the gate electrode. The source and drain electrodes are disposed on the insulating interlayer.

12 Claims, 13 Drawing Sheets

(51) Int. Cl.
*H01L 29/786* (2006.01)
*H01L 21/477* (2006.01)
*H01L 21/469* (2006.01)
*H01L 21/28* (2006.01)
*H01L 21/77* (2017.01)

(52) U.S. Cl.
CPC ...... *H01L 27/1225* (2013.01); *H01L 27/1248* (2013.01); *H01L 27/1255* (2013.01); *H01L 27/3248* (2013.01); *H01L 27/3265* (2013.01); *H01L 29/40111* (2019.08); *H01L 29/7869* (2013.01); *H01L 2021/775* (2013.01); *H01L 2227/323* (2013.01)

(56) References Cited

U.S. PATENT DOCUMENTS

| | | | | |
|---|---|---|---|---|
| 2012/0218495 | A1* | 8/2012 | Oshima | H01L 27/1225 349/61 |
| 2013/0187152 | A1* | 7/2013 | Yamazaki | H01L 29/78693 257/43 |
| 2013/0203214 | A1* | 8/2013 | Isobe | H01L 21/0237 438/104 |
| 2013/0270527 | A1* | 10/2013 | Kwon | H01L 33/0041 257/40 |
| 2013/0320314 | A1* | 12/2013 | Kim | H01L 51/52 257/40 |
| 2014/0042394 | A1* | 2/2014 | Lee | H01L 51/5203 257/40 |
| 2014/0070236 | A1 | 3/2014 | Chen et al. | |
| 2014/0131666 | A1* | 5/2014 | Song | H01L 51/5275 257/40 |
| 2014/0346448 | A1* | 11/2014 | You | H01L 51/5228 257/40 |
| 2014/0353609 | A1* | 12/2014 | Song | H01L 27/3276 257/40 |

OTHER PUBLICATIONS

Morosawa et al., "A Novel Self-Aligned Top-Gate Oxide TFT for AM-OLED Displays," SID 11 Digest, Jun. 2011, pp. 479-482, vol. 42 Issue 1, Society for Information Display.

* cited by examiner

ORGANIC LIGHT EMITTING DISPLAY DEVICE AND METHOD OF MANUFACTURING ORGANIC LIGHT EMITTING DISPLAY DEVICE

CROSS-REFERENCE TO RELATED APPLICATION(S)

This application claims priority under 35 USC § 119 to Korean Patent Application No. 10-2016-0047857, filed on Apr. 19, 2016 in the Korean Intellectual Property Office (KIPO); the Korean Patent Application is incorporated herein in its entirety by reference.

BACKGROUND

1. Field

The technical field is related to organic light emitting display devices, and method of manufacturing organic light emitting display devices.

2. Description of the Related Art

Organic light emitting display (OLED) devices are widely used in electronic devices. The OLED device may include a switching unit for controlling signal transmission.

A switching unit may include a semiconductor element. If the semiconductor element is not sufficiently protected, quality, performance, and/or reliability of the semiconductor element may deteriorate. As a result, performance of the OLED device may be unsatisfactory.

SUMMARY

Some example embodiments are related to an organic light emitting display device including an oxide semiconductor.

Some example embodiments are related to a method of manufacturing an organic light emitting display device including an oxide semiconductor.

According to some example embodiments, an organic light emitting display (OLED) device includes a substrate, a buffer layer, an active layer, a gate insulation layer, a protective insulating layer, a gate electrode, an insulating interlayer, source and drain electrodes, and a sub-pixel structure. The buffer layer is disposed on the substrate. The active layer is disposed on the buffer layer, and has a source region, a drain region, and a channel region. The gate insulation layer is disposed on the channel region. The protective insulating layer is disposed on the buffer layer, the source and drain regions of the active layer, and the gate insulation layer. The gate electrode is disposed on the channel region and on the protective insulating layer. The insulating interlayer is disposed on the gate electrode. The source and drain electrodes are disposed on the insulating interlayer, and are in contact with the source and drain regions of active layer. The sub-pixel structure is disposed on the substrate.

In example embodiments, the buffer layer and the gate insulation layer may include inorganic materials having oxygen.

In example embodiments, the buffer layer and the gate insulation layer may consist essentially of inorganic materials having oxygen.

In example embodiments, the active layer may include oxide semiconductor.

In example embodiments, the protective insulating layer and the gate electrode may have the same metal material.

In example embodiments, the OLED device may further include an auxiliary gate electrode disposed on the gate electrode. The auxiliary gate electrode may be disposed between the gate electrode and the insulating interlayer.

In example embodiments, the sub-pixel structure may include a lower electrode on the substrate, a light emitting layer on the lower electrode, and an upper electrode on the light emitting layer.

In example embodiments, the active layer may extend in a direction from the channel region to the drain region, and an extended portion of the active layer may be defined as a lower electrode region. The extended portion of the active layer may serve as the lower electrode, and the protective insulating layer and the insulating interlayer may expose the lower electrode region of the active layer.

In example embodiments, the OLED device may further include a planarization layer disposed on the substrate. The planarization layer may cover the insulating interlayer, the source and drain electrodes, and the protective insulating layer, and may have an opening that exposes a portion of the lower electrode region of the active layer. The light emitting layer may be disposed in the opening of the planarization layer.

According to some aspect of example embodiments, an OLED device includes a substrate, a buffer layer, an active layer, a gate insulation layer, a gate electrode, a protective insulating layer, an insulating interlayer, source and drain electrodes, and a sub-pixel structure. The buffer layer is disposed on the substrate. The active layer is disposed on the buffer layer, and has a source region, a drain region, and a channel region. The gate insulation layer is disposed on the channel region of the active layer. The gate electrode is disposed on the gate insulation layer. The protective insulating layer is disposed on the buffer layer, the source and drain regions of the active layer, and the gate electrode. The insulating interlayer is disposed on the protective insulating layer. The source and drain electrodes are disposed on the insulating interlayer, the source and drain electrodes being in contact with the source and drain regions of active layer. The sub-pixel structure is disposed on the substrate.

In example embodiments, the buffer layer and the gate insulation layer may include inorganic materials having oxygen, and the active layer may include oxide semiconductor.

In example embodiments, the protective insulating layer and the gate electrode may have the same metal material.

According to some example embodiments, a method of manufacturing an OLED device may include the following steps. A substrate is provided. A buffer layer is formed on the substrate. An active layer is formed on the buffer layer, and has a source region, a drain region, and a channel region. A gate insulation layer is formed on the channel region. A metal layer is formed on the buffer layer, the source and drain regions of the active layer, and the gate insulation layer. A protective insulating layer is formed using part of the metal layer by performing a heat treatment process on the substrate. The protective insulating layer and a gate electrode are formed by partially removing the metal layer. An insulating interlayer is formed on the gate electrode. Source and drain electrodes are formed on the insulating interlayer, and are in contact with the source and drain regions of active layer. A sub-pixel structure is formed on the source and drain electrodes.

In example embodiments, the active layer may include oxide semiconductor.

In example embodiments, the buffer layer and the gate insulation layer may include inorganic materials having oxygen.

In example embodiments, when the heat treatment process is performed on the substrate, i) the buffer layer may provide the oxygen to the metal layer in a portion where the metal layer is in contact with the buffer layer, ii) the active layer may provide the oxygen to the metal layer in a portion where the metal layer is in contact with the source and drain regions of the active layer, and iii) the gate insulation layer may provide the oxygen to the metal layer in a portion where the metal layer is in contact with the gate insulation layer.

In example embodiments, the metal layer that receives the oxygen may convert a portion of the metal layer into a metal insulation layer, and the metal insulation layer may be defined as the protective insulating layer.

In example embodiments, the source and drain regions of the active layer that provides the oxygen may be metallized.

In example embodiments, forming the protective insulating layer and a gate electrode by partially removing the metal layer may include forming a photoresist on the metal layer that is located on the gate insulation layer, etching the metal layer, and forming i) the gate electrode in a portion where the photoresist is formed and ii) the protective insulating layer on the buffer layer, the source and drain regions of the active layer, and the gate insulation layer.

In example embodiments, the protective insulating layer and the gate electrode may have the same metal material.

An embodiment may be related to a display device, e.g., an OLED device. The display device may include a substrate, an active layer, a gate electrode, a gate insulation layer, a protective insulating layer, and a light emitting member. The active layer may overlap the substrate and may include a source portion, a drain portion, and a channel portion. The gate electrode may be positioned over the channel portion. The gate insulation layer may be positioned between the active layer and the gate electrode and may overlap the channel portion. The gate insulation layer may be positioned between the channel portion and the gate electrode in a direction perpendicular to a face (e.g., bottom face) of the substrate. In solid geometry, a face is a flat (planar) surface that forms part of the boundary of a solid object. The protective insulating layer may directly contact each of the gate electrode, the source portion, and the drain portion without directly contacting the channel portion. The light emitting member may overlap the substrate.

The protective insulating layer may directly contact the gate electrode because the protective insulating layer and the gate electrode may be formed from the same material layer, e.g., the same metal layer. The protective insulating layer may directly contact the source portion and the drain portion for receiving oxygen from the source portion and the drain portion. The protective insulating layer may not directly contact the channel portion, such that protective insulating layer may not receive oxygen from the channel portion.

The protective insulating layer may directly contact at least two faces of the gate insulation layer. The two faces of the gate insulation layer may be opposite each other. The two faces of the gate insulation layer may be oriented at an acute angle or an obtuse angle with respect to each other.

The protective insulating layer may directly contact exactly one face of the gate electrode. The face of the gate electrode may be parallel to an interface between the active layer and the gate insulation layer.

The protective insulating layer may directly contact at least two faces of the gate electrode. The two faces of the gate electrode may be opposite each other. The two faces of the gate electrode may be oriented at an acute angle or an obtuse angle with respect to each other.

The protective insulating layer may directly contact at least three faces of the gate insulation layer.

A section of the protective insulating layer may be positioned between the gate electrode and the gate insulation layer and may directly contact each of the gate electrode and the gate insulation layer. The gate insulation layer may be positioned between the channel portion and the section of the protective insulating layer and may directly contact the channel portion.

The gate electrode may be formed of a material. The protective insulating layer may be formed of a compound that includes the material.

The gate electrode may be formed of a metal. The protective insulating layer may be formed of an oxide of the metal.

The display device may include a storage capacitor. The storage capacitor may include a capacitor electrode. The capacitor electrode may be spaced from the gate electrode, may directly contact the protective insulating layer, and may be formed of a metal. The protective insulating layer may be formed of an oxide of the metal.

The protective insulating layer may directly contact a first face of the active layer and a first face of a buffer layer. The light emitting member may directly contact the first face of the active layer. A second face of the active layer may directly contact the first face of the buffer layer and may be opposite the first face of the active layer. A second face of the buffer layer may directly contact the substrate and may be opposite the first face of the buffer layer.

An embodiment may be related to method of manufacturing a display device, e.g., an OLED device. The method may include the following steps: providing a substrate; providing an active layer that overlaps the substrate and includes a source portion, a drain portion, and a channel portion; providing a gate electrode that is positioned over the channel portion; providing a gate insulation layer that is positioned between the active layer and the gate electrode and overlaps the channel portion; providing a protective insulating layer that directly contacts each of the gate electrode, the source portion, and the drain portion without directly contacting the channel portion; and providing a light emitting member that overlaps the substrate.

The method may include the following steps: providing a material layer that directly contacts the source portion or the drain portion without directly contacting the channel portion; and providing a first oxygen set from the source portion or the drain portion to the material layer to form a first oxide portion. The protective insulating layer may include the first oxide portion. The first oxide portion may be a portion of the protective insulating layer that directly contacts the source portion of the drain portion.

The method may include the following steps: providing a buffer layer that overlaps the substrate; and providing a second oxygen set from the buffer layer to the material layer to form a second oxide portion. The protective insulating layer may include the second oxide portion. The second oxide portion may be a portion of the protective insulating layer that directly contacts the buffer layer.

The method may include partially removing the material layer to form the gate electrode and a capacitor electrode after the first oxide portion and the second oxide portion have been formed.

The active layer may include an electrode portion that is spaced from the channel portion and/or abuts the drain portion. The method may include the following steps: providing a second oxygen set from the electrode portion to the material layer to form a second oxide portion; removing the second oxide portion; and providing the light emitting member to directly contact the electrode portion. The second oxide portion may be a portion of the material layer that directly contacts the electrode portion.

The method may include the following steps: providing a preliminary insulating interlayer that directly contacts the second oxide set; and removing a portion of the preliminary insulating interlayer that overlaps the electrode portion to form an insulating interlayer when or before removing the second oxide portion (e.g., a portion of the material layer that directly contacts the electrode portion).

The method may include partially removing the material layer to form the gate electrode after the first oxide portion has been formed.

The method may include the following steps: providing a second oxygen set from the gate insulation layer through a face of the gate insulation layer to the material layer to form a second oxide portion; and partially removing the material layer to form the gate electrode after the second oxide portion has been formed. The protective insulating layer may include the second oxide portion. The second oxide portion may be positioned between the gate electrode and the gate insulation layer and may directly contact each of the gate electrode and the face of the gate insulation layer.

The method may include the following steps: providing a second oxygen set from the gate insulation layer through a first face of the gate insulation layer to the material layer to form a second oxide portion; and providing a third oxygen set from the gate insulation layer through a second face of the gate insulation layer to the material layer to form a third oxide portion. The protective insulating layer may include the second oxide portion and the third oxide portion and may directly contact each of the first face of the gate insulation layer and the second face of the gate insulation layer. The two faces of the gate insulation layer may be opposite each other. The two faces of the gate insulation layer may be oriented at an acute angle or an obtuse angle with respect to one another. The second oxide portion and the third oxide portion may be opposite each other. The second oxide portion and the third oxide portion may be oriented at an acute angle or an obtuse angle with respect to each other.

The method may include using the gate insulation layer to block the channel portion from providing oxygen to the material layer when using the source portion to provide the first oxygen set.

In an OLED device, according to example embodiments, the protective insulating layer may sufficiently protect the active layer. In embodiments, as the gate electrode and the protective insulating layer are substantially simultaneously formed, a manufacturing cost of the display device may be minimized. In embodiments, since the lower electrode region (or electrode portion) of the active layer serves as a lower electrode of a light emitting structure and since the planarization layer serves as a pixel defining layer, the display device may not require an additional lower electrode or an additional pixel defining layer. Accordingly, a manufacturing cost of the display device may be minimized.

In a method of manufacturing an OLED device, according to example embodiments, the protective insulating layer may sufficiently protect the active layer. In embodiments, as the gate electrode and the protective insulating layer are substantially simultaneously formed, the number of required masks in a related manufacturing process may be minimized. In embodiments, since the lower electrode region (or electrode portion) of the active layer serves as a lower electrode and since the planarization layer serves as a pixel defining layer, the display device may not require an additional lower electrode or an additional pixel defining layer. Accordingly, the number of required masks in a related manufacturing process may be minimized.

DETAILED DESCRIPTION

Embodiments are explained with reference to the accompanying drawings.

Figure 1:
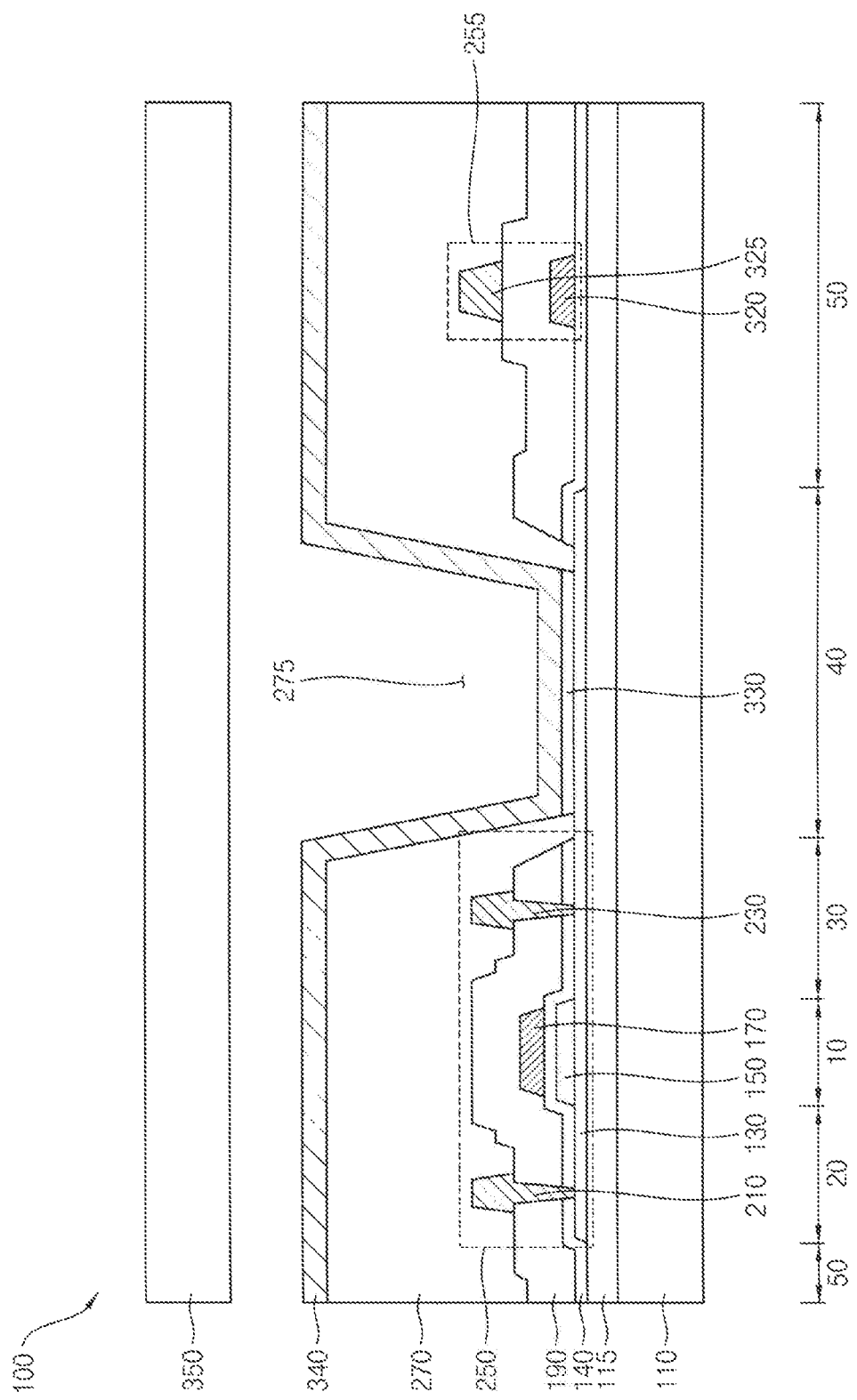
FIG. 1 is a cross-sectional view illustrating an organic light emitting display (OLED) device, in accordance with example embodiments.
Figure 2:
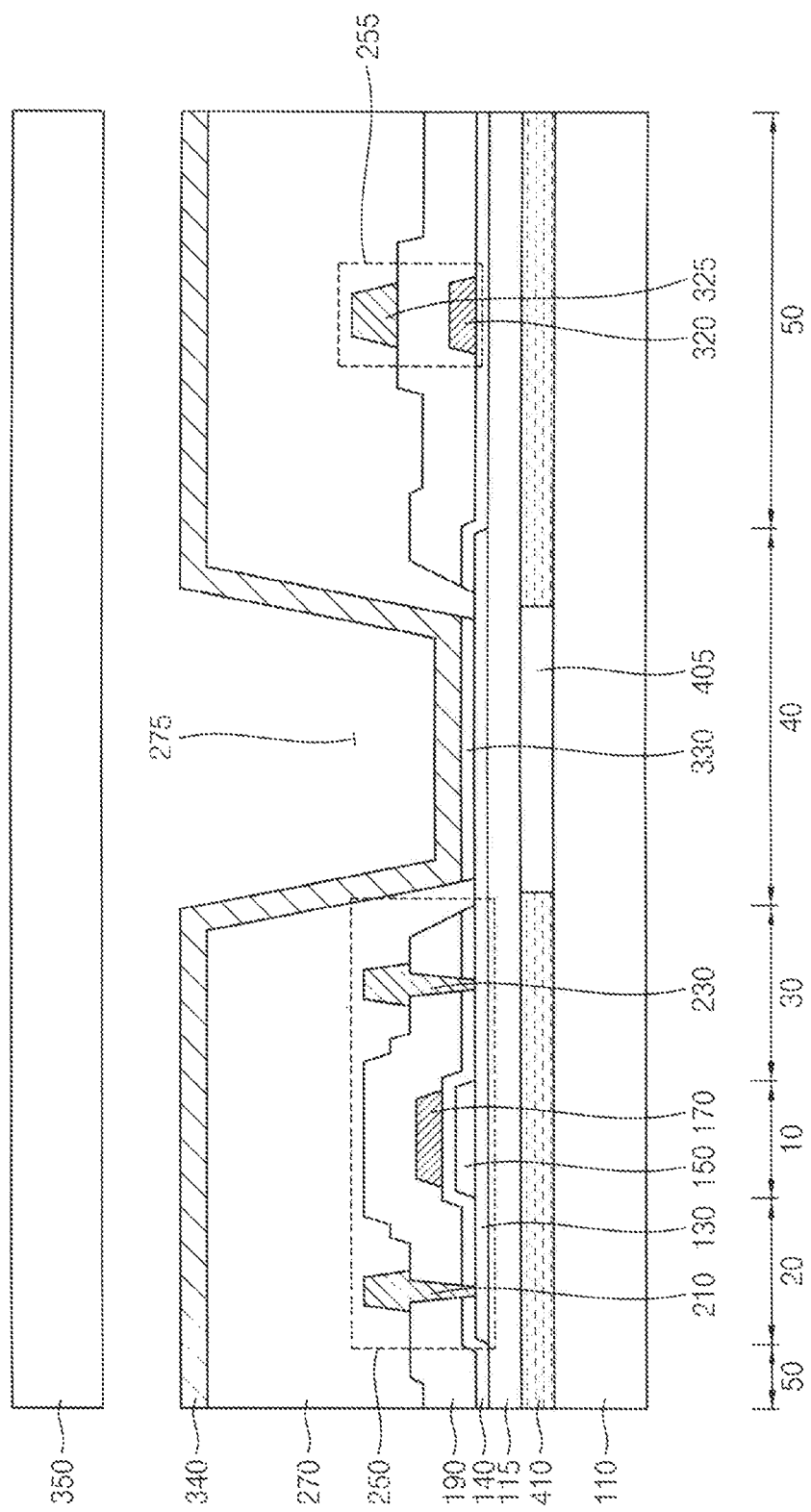
FIG. 2 is a cross-sectional view for describing a color filter included in the OLED device of FIG. 1.

FIG. 1 is a cross-sectional view illustrating an organic light emitting display (OLED) device, in accordance with example embodiments, and FIG. 2 is a cross-sectional view for describing a color filter included in the OLED device of FIG. 1.

Referring to FIGS. 1 and 2, an OLED device 100 may include a substrate 110, a buffer layer 115, a semiconductor element 250, a storage capacitor 255, a planarization layer 270, a sub-pixel structure (e.g., a light emitting member), an encapsulation substrate 350, etc. Here, the semiconductor element 250 (or switching element 250) may include an active layer 130, a gate insulation layer 150, a protective insulating layer 140, a gate electrode 170, an insulating interlayer 190, a source electrode 210, and a drain electrode 230. In example embodiments, the active layer 130 may have a channel region 10 (or channel portion 10), a source region 20 (or source portion 20), a drain region 30 (or drain portion 30), and a lower electrode region 40 (or electrode portion 40). In addition, the storage capacitor 255 may include a first electrode 320 and a second electrode 325 (e.g., capacitor electrodes). Further, the sub-pixel structure may include a light emitting layer 330 and an upper electrode 340. A thickness of the upper electrode 340 may be greater than that of the active layer 130, and the upper electrode 340 may reflect a light that is emitted from the light emitting layer 330 in a direction from the encapsulation substrate 350 into substrate 110.

The lower electrode region 40 of the active layer 130 may serve as a lower electrode (e.g., an anode electrode), and the planarization layer 270 may serve as a pixel defining layer. Accordingly, as the OLED device 100 does not include the lower electrode and the pixel defining layer, the OLED device 100 may serve as the OLED device of a bottom emission structure capable of reducing a manufacturing cost.

The substrate 110 may be provided. The substrate 110 may include transparent materials. For example, the substrate 110 may include a quartz substrate, a synthetic quartz substrate, a calcium fluoride substrate, a fluoride-doped quartz substrate, a sodalime glass substrate, a non-alkali glass substrate etc. In embodiments, the substrate 110 may include a flexible transparent material such as a flexible transparent resin substrate (e.g., a polyimide substrate). For example, the polyimide substrate may include a first polyimide layer, a barrier film layer, a second polyimide layer, etc. Since the polyimide substrate is relatively thin and flexible, the polyimide substrate may be disposed on a rigid glass substrate to help support the formation of the semiconductor element 250, the storage capacitor 255, and the sub-pixel structure. That is, the substrate 110 may have a structure in which the first polyimide layer, the barrier film layer and the second polyimide layer are stacked on the rigid glass substrate. In a manufacturing the OLED device 100, after the buffer layer 115 is provided on the second polyimide layer of the polyimide substrate, the semiconductor element 250, the storage capacitor 255, and the sub-pixel structure may be disposed on the buffer layer 115. After the semiconductor element 250, the storage capacitor 255, and the sub-pixel structure are formed on the buffer layer 115, the rigid glass substrate on which the polyimide substrate is disposed may be removed. It may be difficult to directly form the semiconductor element 250, the storage capacitor 255, and the sub-pixel structure on the polyimide substrate because the polyimide substrate is relatively thin and flexible. Accordingly, the semiconductor element 250, the storage capacitor 255, and the sub-pixel structure are formed on the polyimide substrate and the rigid glass substrate, and then the polyimide substrate may serve as the substrate 110 of the OLED device 100 after the removal of the rigid glass substrate.

The buffer layer 115 may be disposed on the substrate 110. The buffer layer 115 may cover the entire substrate 110. The buffer layer 115 may prevent the diffusion of metal atoms and/or impurities from the substrate 110 into the semiconductor element 250. The buffer layer 115 may improve a surface flatness of the substrate 110 when a surface of the substrate 110 is relatively uneven. According to a type of the substrate 110, at least two buffer layers 115 may be provided on the substrate 110, or the buffer layer 115 may not be required. The buffer layer 115 may include one or more organic materials and/or one or more inorganic materials. The one or more organic materials may include at least one of a photoresist, a polyacryl-based resin, a polyimide-based resin, a polyamide-based resin, a siloxane-based resin, an acryl-based resin, and an epoxy-based resin, etc. The one or more inorganic materials may include at least one of a silicon compound, and a metal oxide, etc. For example, the buffer layer 115 may include at least one of silicon oxide (SiOx), silicon nitride (SiNx), silicon oxynitride (SiOxNy), silicon oxycarbide (SiOxCy), silicon carbon nitride (SiCxNy), aluminum oxide (AlOx), aluminum nitride (AlNx), tantalum oxide (TaOx), hafnium oxide (HfOx), zirconium oxide (ZrOx), and titanium oxide (TiOx), etc. In example embodiments, the buffer layer 115 may be formed of one or more inorganic materials having oxygen. For example, after a metal layer is disposed on the buffer layer 115, the buffer layer 115 may provide oxygen to the metal layer in a portion where the metal layer is in direct contact with the buffer layer 115 when a heat treatment process is performed on the substrate 110. In example embodiments, the portion where the metal layer (e.g., the protective insulating layer 140) is in contact with the buffer layer 115 may be defined as a contact region 50. Accordingly, the metal layer that receives the oxygen from the buffer layer 115 may convert a portion of the metal layer into a metal oxide insulation layer, and the metal insulation oxide layer may be an oxide portion of the protective insulating layer 140.

The active layer 130 may be disposed on the buffer layer 115. The active layer 130 may have the channel region 10, the source region 20, and the drain region 30. The active layer 130 may include at least one of an oxide semiconductor, an inorganic semiconductor (e.g., amorphous silicon, polysilicon, etc.), an organic semiconductor, etc. In example embodiments, the active layer 130 may be formed of an oxide semiconductor. The active layer 130 may be composed oxide semiconductor including at least one of two-component compound (ABx), ternary compound (ABxCy), four-component compound (ABxCyDz), etc. These compounds contain indium (In), zinc (Zn), gallium (Ga), tin (Sn), titanium (Ti), aluminum (Al), hafnium (Hf), zirconium (Zr), magnesium (Mg), etc. For example, the active layer 130 may include at least one of zinc oxide (ZnOx), gallium oxide (GaOx), TiOx, tin oxide (SnOx), indium oxide (InOx), indium-gallium oxide (IGO), indium-zinc oxide (IZO), indium tin oxide (ITO), gallium zinc oxide (GZO), zinc magnesium oxide (ZMO), zinc tin oxide (ZTO), zinc zirconium oxide (ZnZrxOy), indium-gallium-zinc oxide (IGZO), indium-zinc-tin oxide (IZTO), indium-gallium-hafnium oxide (IGHO), tin-aluminum-zinc oxide (TAZO), indium-gallium-tin oxide (IGTO), etc. In embodiments, the active layer 130 may be an oxide semiconductor layer including In. For example, after the metal layer is disposed on the active layer 130, the source and drain regions 20 and 30 of the active layer 130 may provide oxygen included in the oxide semiconductor layer to the metal layer in a portion where the metal layer is in contact with the source and drain regions 20 and 30 of the active layer 130 when the heat treatment process is performed on the substrate 110. Here, In and oxygen may have a weak bound state, and the oxide semiconductor layer including In may effectively provide oxygen to the metal layer. Accordingly, the metal layer that receives the oxygen from the source and drain regions 20 and 30 of the active layer 130 may convert a portion of the metal layer into a metal oxide insulation layer, and the metal oxide insulation layer may be an oxide portion of the protective insulating layer 140. In addition, the source and drain regions 20 and 30 of the active layer 130 that provides the oxygen may be metalized. That is, electrical resistance of the source and drain regions 20 and 30 may be relatively less than that of the channel region 10.

In example embodiments, the active layer 130 may extend in a direction from the channel region 10 into the drain region 30. An extended portion of the active layer 130 may be defined as the lower electrode region 40. The extended portion of the active layer 130 may serve as a lower electrode of a light emitting structure. For example, after the metal layer is disposed on the active layer 130, the lower electrode region 40 of the active layer 130 may provide oxygen included in the oxide semiconductor layer to the metal layer in a portion where the metal layer is in contact with the lower electrode region 40 of the active layer 130 when the heat treatment process is performed on the substrate 110. Accordingly, the metal layer that receives the oxygen from the lower electrode region 40 of the active layer 130 may convert a portion of the metal layer into a metal oxide insulation layer, and the metal oxide insulation layer may be an oxide portion of the protective insulating layer 140. In addition, the lower electrode region 40 of the active layer 130 that provides the oxygen may be metalized. That is, electrical resistance of the lower electrode region 40 may be relatively less than that of the channel region 10. As the OLED device 100 does not require an additional lower electrode, a manufacturing cost of the OLED device 100 may be minimized. An oxide portion of the protective insulating layer 140 that is disposed on the lower electrode region 40 of the active layer 130 may be removed in a process that an opening 275 of the planarization layer 270 is formed.

The gate insulation layer 150 may be disposed in the channel region 10 on the active layer 130 (e.g., on the channel region 10 of the active layer 130). The gate insulation layer 150 may be interposed between the gate electrode 170 and the active layer 130 such that the gate electrode 170 is spaced apart from the active layer 130. The gate insulation layer 150 may include organic materials or inorganic materials. In example embodiments, the gate insulation layer 150 may be formed of inorganic materials including oxygen. For example, after a metal layer is disposed on the gate insulation layer 150, the gate insulation layer 150 may provide the oxygen through at least two faces of the gate insulation layer 150 to the metal layer in portions where the metal layer is in contact with the gate insulation layer 150 when a heat treatment process is performed on the substrate 110. Accordingly, portions of the metal layer that receive oxygen from the gate insulation layer 150 may convert into metal oxide insulation layer portions, and the metal oxide insulation layer portions may be oxide portions of the protective insulating layer 140.

The protective insulating layer 140 may directly contact each of the buffer layer 115, the source and drain regions 20 and 30 of the active layer 130, and the gate insulation layer 150. The protective insulating layer 140 may expose the lower electrode region 40 of the active layer 130 or a portion of the lower electrode region 40. In embodiments, the protective insulating layer 140 may expose a portion of the source region 20 and a portion of the drain region 30. The protective insulating layer 140 may protect the active layer 130. Without protection, the active layer 130 that is formed of oxide semiconductor may be affected by process conditions (e.g., vacuum, moisture, oxygen, and/or hydrogen). The protective insulating layer 140 may protect the active layer 130 such that electrical characteristics of the active layer 130 may not be substantially affected by vacuum, moisture, oxygen, hydrogen, etc. The protective insulating layer 140 may include inorganic materials. For example, the protective insulating layer 140 may include at least one of AlOx, TaOx, HfOx, ZrOx, TiOx, etc. In example embodiments, the protective insulating layer 140 and the gate electrode 170 may have the same metal material. For example, after the buffer layer 115, the active layer 130, and the gate insulation layer 150 are disposed, the metal layer may be disposed on the buffer layer 115, the active layer 130, and the gate insulation layer 150. After a metal layer is disposed, the gate insulation layer 150 and the source, drain, and lower electrode regions 20, 30, and 40 may provide the oxygen to the metal layer in a portion where the metal layer is in contact with the buffer layer 115 and in a portion where the metal layer is in contact with the source, drain, and lower electrode regions 20, 30, and 40 of the active layer 130 when a heat treatment process is performed on the substrate 110. As a result, the metal layer may transform into two layers. In embodiments, the protective insulating layer 140 may be formed from a portion (e.g., a lower portion) of the metal layer. For example, a first layer of the metal layer that receives oxygen from the buffer layer 115, the gate insulation layer 150, the source, drain, and lower electrode regions 20, 30, and 40 of the active layer 130 may be converted into a metal oxide insulation layer, and a second layer that is disposed on the first layer of the metal layer may remain a metal layer. After the heat treatment process, the gate electrode 170 and the protective insulating layer 140 may be substantially simultaneously (or concurrently) formed by partially removing the metal layer (and partially removing the metal oxide insulation layer). In embodiments, the gate electrode 170 is formed of Al, and the protective insulating layer 140 may be formed of AlOx. In embodiments, the gate electrode 170 is formed of Ti, and the protective insulating layer 140 may be formed of TiOx.

The gate electrode 170 may be disposed on the channel region 10 and on the protective insulating layer 140. The gate electrode 170 may overlap the gate insulation layer 150. As described above, after heat treatment process, the gate electrode 170 may be formed by partially removing the remaining metal layer. The gate electrode 170 may include at least one of a metal, a metal alloy, metal nitride, conductive metal oxide, transparent conductive materials, etc. For example, the gate electrode 170 may include at least one of gold (Au), silver (Ag), Al, an alloy of aluminum, aluminum nitride (AlNx), an alloy of silver, tungsten (W), tungsten nitride (WNx), copper (Cu), an alloy of copper, nickel (Ni), chrome (Cr), chrome nitride (CrNx), molybdenum (Mo), an alloy of molybdenum, Ti, titanium nitride (TiNx), platinum (Pt), tantalum (Ta), tantalum nitride (TaNx), neodymium (Nd), scandium (Sc), strontium ruthenium oxide (SRO), zinc oxide (ZnOx), SnOx, InOx, GaOx, ITO, IZO, etc. These may be used alone or in a suitable combination thereof. In example embodiments, the gate electrode 170 may include a metal of a high reactivity (e.g., a metal that is relatively easily oxidized). For example, the gate electrode 170 may be formed of Al or Ti. In embodiments, the gate electrode 170 may have a multi-layer structure.

The first electrode 320 of the storage capacitor 255 may be disposed in the contact region 50 on the protective insulating layer 140. The first electrode 320 may be spaced apart from the lower electrode region 40 of the active layer 130 in a direction from the channel region 10 into the lower electrode region 40. The first electrode 320 and the gate electrode 170 may be simultaneously formed using the same material.

The insulating interlayer 190 may be disposed on the gate electrode 170, the first electrode 320, and the protective insulating layer 140. The insulating interlayer 190 may cover the gate electrode 170, the first electrode 320, and the protective insulating layer 140 on the substrate 110, and may expose the lower electrode region 40 of the active layer 130. For example, the insulating interlayer 190 may cover the gate electrode 170, the first electrode 320, and the protective insulating layer 140, and may be disposed as a substantially uniform thickness along a profile of the gate electrode 170, the first electrode 320, and the protective insulating layer 140. In embodiments, the insulating interlayer 190 may sufficiently cover the gate electrode 170, the first electrode 320, and the protective insulating layer 140, and may have a substantially even surface without a step around the gate electrode 170, the first electrode 320, and the protective insulating layer 140. The insulating interlayer 190 may include organic materials or inorganic materials.

The source electrode 210 and the drain electrode 230 may be disposed in the source region 20 and the drain region 30 on the insulating interlayer 190, respectively. The source electrode 210 may be in contact with the source region 20 of the active layer 130 via a contact hole formed by removing a portion of the insulating interlayer 190 and the protective insulating layer 140 each. The drain electrode 230 may be in contact with a drain region 30 of the active layer 130 via a contact hole formed by removing a portion of the insulating interlayer 190 and the protective insulating layer 140 each. Each of the source and drain electrodes 210 and 230 may include a metal, a metal alloy, metal nitride, conductive metal oxide, transparent conductive materials, etc. These may be used alone or in a suitable combination thereof. In embodiments, each of the source and drain electrodes 210 and 230 may have a multi-layered structure. Accordingly, the semiconductor element 250 including the active layer 130, the gate insulation layer 150, the protective insulating layer 140, the gate electrode 170, the insulating interlayer 190, the source electrode 210, and the drain electrode 230 may be disposed. In some example embodiments, a configuration of the semiconductor element 250 may include the active layer 130, the gate insulation layer 150, the protective insulating layer 140, the gate electrode 170, the insulating interlayer 190, and the source electrode 210. That is, the drain electrode 230 may not be included in the configuration of the semiconductor element 250. In some example embodiments, the drain electrode 230 may be in contact with another semiconductor element included in the OLED device 100.

In example embodiments, the semiconductor element 250 of the OLED device 100 includes a top gate structure, but not being limited thereto. For example, in some example embodiments, the semiconductor element may include a bottom gate structure.

The second electrode 325 of the storage capacitor 255 may be disposed in the contact region 50 on the insulating interlayer 190. The second electrode 325 may be disposed on a portion under which the first electrode 320 is located. The second electrode 325, the source electrode 210, and the drain electrode 230 may be simultaneously formed using the same material. Accordingly, the storage capacitor 255 including the first electrode 320 and the second electrode 325 may be disposed.

The planarization layer 270 may be disposed on the insulating interlayer 190, the source and drain electrodes 210, and 230, and the second electrode 325. The planarization layer 270 may cover the insulating interlayer 190, the source and drain electrodes 210, and 230, and the second electrode 325 on the substrate 110, and may have the opening 275 exposing a portion of the lower electrode region 40 of the active layer 130. In example embodiments, the light emitting layer 330 may be disposed in the opening 275 of the planarization layer 270, and the planarization layer 270 may serve as a pixel defining layer. For example, the planarization layer 270 may be disposed as a relatively high thickness to sufficiently cover the insulating interlayer 190, the source and drain electrodes 210 and 230, and the second electrode 325. In this case, the planarization layer 270 may have a substantially even upper surface, and a planarization process may be further performed on the planarization layer 270 to implement the even upper surface of the planarization layer 270. The planarization layer 270 may include organic materials or inorganic materials.

The light emitting layer 330 may be disposed in lower electrode region 40 on an upper surface of the active layer 130 that is exposed by the planarization layer 270. The light emitting layer 330 may have a multi-layered structure including an emission layer (EL), a hole injection layer (HIL), a hole transfer layer (HTL), an electron transfer layer (ETL), an electron injection layer (EIL), etc. The EL of the light emitting layer 330 may be formed using at least one of light emitting materials capable of generating light of different colors (e.g., red light, blue light, green light, etc.). In embodiments, the EL of the light emitting layer 330 may generally generate a white color of light by stacking a plurality of light emitting materials capable of generating light of different colors such as red light, green light, blue light, etc. In this case, as illustrated in FIG. 2, a color filter 405 may be disposed under the light emitting layer 330 (e.g., the color filter 405 may be disposed on a lower surface of the substrate 110 or between the substrate 110 and the buffer layer 115). The color filter 405 may include at least one selected from a red color filter, a green color filter, and a blue color filter. In embodiments, the color filter 405 may include a yellow color filter, a cyan color filter, and a magenta color filter. The color filter 405 may be formed of a photosensitive resin (or color photoresist), etc. In addition, a light blocking member 410 may be disposed under the semiconductor element 250 and the storage capacitor 255 to prevent the semiconductor element 250 and the storage capacitor 255 from being reflected from an external light. The light blocking member 410 may block the external light using a black matrix or a color filter. The block matrix may include black materials. The black materials may include carbon black, titanium nitride oxide, titanium black, phenylene black, aniline black, cyanine black, nigrosine acid black, a black resin, etc.

The upper electrode 340 may be disposed on the planarization layer 270 and the light emitting layer 330. In embodiments, the upper electrode 340 may be disposed on the light emitting layer 330 and a portion of the planarization layer 270. The OLED device 100 in the lower electrode region 40 of the active layer 130 may display a displaying image in a direction from the encapsulation substrate 350 into the substrate 110 (e.g., a bottom emission structure). Thus, a thickness of the upper electrode 340 may be greater than that of the active layer 130 such that a light emitted from the light emitting layer 330 is reflected from the upper electrode 340 in the direction. In some example embodiments, when a portion of the light emitted from the light emitting layer 330 is reflected from the upper electrode 340 and a remaining portion of the light travels through the upper electrode 340 (e.g., the upper electrode 340 is a transflective electrode), the OLED device 100 may serve as a dual sided OLED device. The upper electrode 340 may include a metal, a metal alloy, metal nitride, conductive metal oxide, etc. These may be used alone or in a suitable combination thereof. In embodiments, the upper electrode 340 may have a multi-layered structure. Accordingly, the sub-pixel structure including the light emitting layer 330 and the upper electrode 340 may be disposed.

In example embodiments, the OLED device 100 includes the bottom emission structure, but not being limited thereto. For example, in some example embodiments, the OLED device 100 may include a top emission structure.

The encapsulation substrate 350 may be disposed on the upper electrode 340. The encapsulation substrate 350 and the substrate 110 may include substantially the same material. For example, the encapsulation substrate 350 may include a quartz substrate, a synthetic quartz substrate, a calcium fluoride substrate, a fluoride-doped quartz substrate, a sodalime glass substrate, a non-alkali glass substrate, etc. In some example embodiments, the encapsulation substrate 350 may include a transparent inorganic material or flexible plastic. For example, the encapsulation substrate 350 may include a flexible transparent resin substrate. In this case, to increase flexibility of the OLED device 100, the encapsulation substrate 350 may include a stacked structure where at least one inorganic layer and at least one organic layer are alternately stacked.

In the OLED device 100 in accordance with example embodiments, the protective insulating layer 140 may sufficiently protect the active layer 130. In embodiments, as the gate electrode 170 and the protective insulating layer 140 are substantially simultaneously formed and/or are formed from a same material layer, a manufacturing cost of the OLED device 100 may be minimized. In embodiments, since the lower electrode region 40 of the active layer 130 serves as a lower electrode of a light emitting structure and since the planarization layer 270 serves as a pixel defining layer, the OLED device 100 may not require an additional lower electrode or an additional pixel defining layer. Accordingly, a manufacturing cost of the OLED device 100 may be minimized.

FIGS. 3, 4, 5, 6, 7, 8, 9, 10, and 11 are cross-sectional views illustrating a method of manufacturing an OLED device, in accordance with example embodiments.

Figure 3:
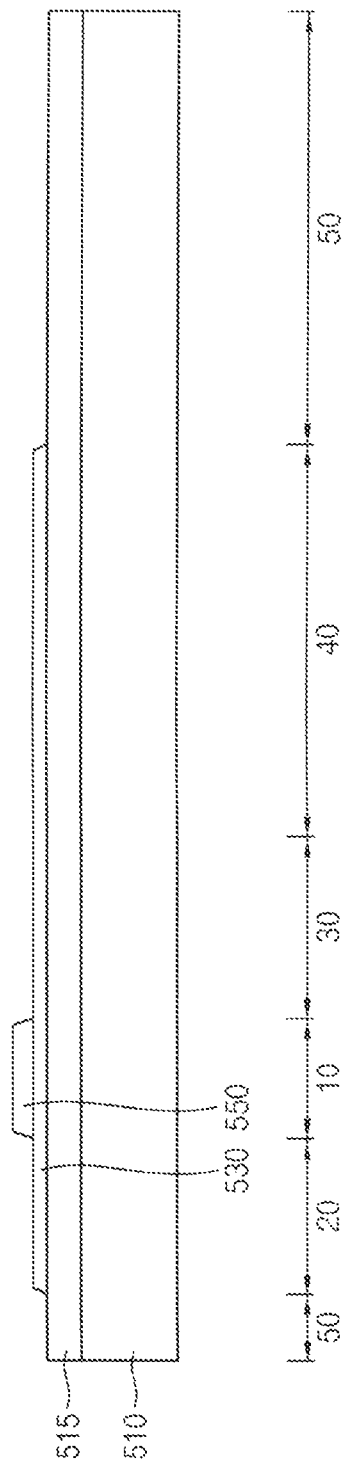
FIG. 3, FIG. 4, FIG. 5, FIG. 6, FIG. 7, FIG. 8, FIG. 9, FIG. 10, and FIG. 11 are cross-sectional views illustrating structures formed in a method of manufacturing an OLED device in accordance with example embodiments.

Referring to FIG. 3, a substrate 510 may be provided. The substrate 510 may include transparent materials. For example, the substrate 510 may be formed using a quartz substrate, a synthetic quartz substrate, a calcium fluoride substrate, a fluoride-doped quartz substrate, a sodalime glass substrate, a non-alkali glass substrate etc. In embodiments, the substrate 510 may include a flexible transparent material such as a flexible transparent resin substrate (e.g., a polyimide substrate). For example, the polyimide substrate may include a first polyimide layer, a barrier film layer, a second polyimide layer, etc.

A buffer layer 515 may be formed on the substrate 510. The buffer layer 515 may be formed on the entire substrate 510. The buffer layer 515 may prevent the diffusion of metal atoms and/or impurities from the substrate 510. Additionally, the buffer layer 515 may improve a surface flatness of the substrate 510 when a surface of the substrate 510 is relatively uneven. According to a type of the substrate 510, at least two buffer layers 515 may be provided on the substrate 510, or the buffer layer 515 may not be formed. The buffer layer 515 may include organic materials or inorganic materials. The organic materials may be formed using at least one of a photoresist, a polyacryl-based resin, a polyimide-based resin, a polyamide-based resin, a siloxane-based resin, an acryl-based resin, and an epoxy-based resin, etc. In addition, the inorganic materials may include at least one of a silicon compound, and a metal oxide, etc. For example, the buffer layer 515 may be formed using at least one of SiOx, SiNx, SiOxNy, SiOxCy, SiCxNy, AlOx, AlNx, TaOx, HfOx, ZrOx, and TiOx, etc. In example embodiments, the buffer layer 515 may be formed of inorganic materials having oxygen.

An active layer 530 may be formed on the buffer layer 515. The active layer 530 may have a channel region 10 (or channel portion 10), a source region 20 (or source portion 20), and a drain region 30 (or drain portion 30). The active layer 530 may be formed using one or more of an oxide semiconductor, an inorganic semiconductor (e.g., amorphous silicon, polysilicon, etc.), an organic semiconductor, etc. In example embodiments, the active layer 530 may be formed of the oxide semiconductor. The active layer 530 may be composed of oxide semiconductor including at least one of two-component compound (ABx), ternary compound (ABxCy), four-component compound (ABxCyDz), etc. These compounds contain at least one of In, Zn, Ga, Sn, Ti, Al, Hf, Zr, Mg, etc. For example, the active layer 530 may be formed using at least one of ZnOx, GaOx, TiOx, SnOx, InOx, IGO, IZO, ITO, GZO, ZMO, ZTO, ZnZrxOy, IGZO, IZTO, IGHO, TAZO, IGTO, etc. In embodiments, the active layer 530 may be an oxide semiconductor layer including In. In example embodiments, the active layer 530 may extend in a direction from the channel region 10 into the drain region 30. An extended portion of the active layer 530 may be defined as the lower electrode region 40 (or lower electrode portion 40). The extended portion of the active layer 530 may serve as a lower electrode.

A gate insulation layer 550 may be formed in the channel region 10 on the active layer 530 (e.g., on the channel region 10 of the active layer 530). The gate insulation layer 550 may be formed using organic materials or inorganic materials. In example embodiments, the gate insulation layer 550 may be formed of inorganic materials including oxygen.

Figure 4:
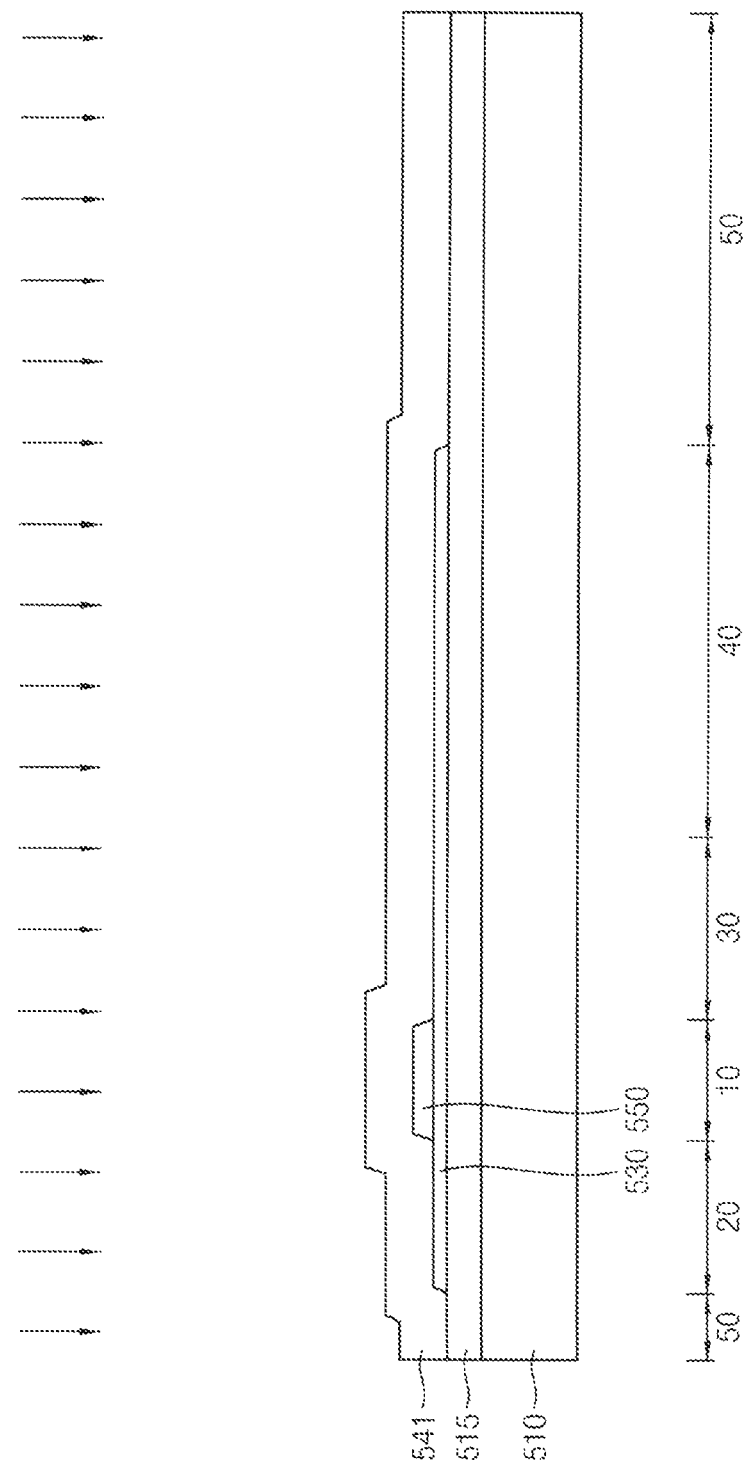
Figure 5:
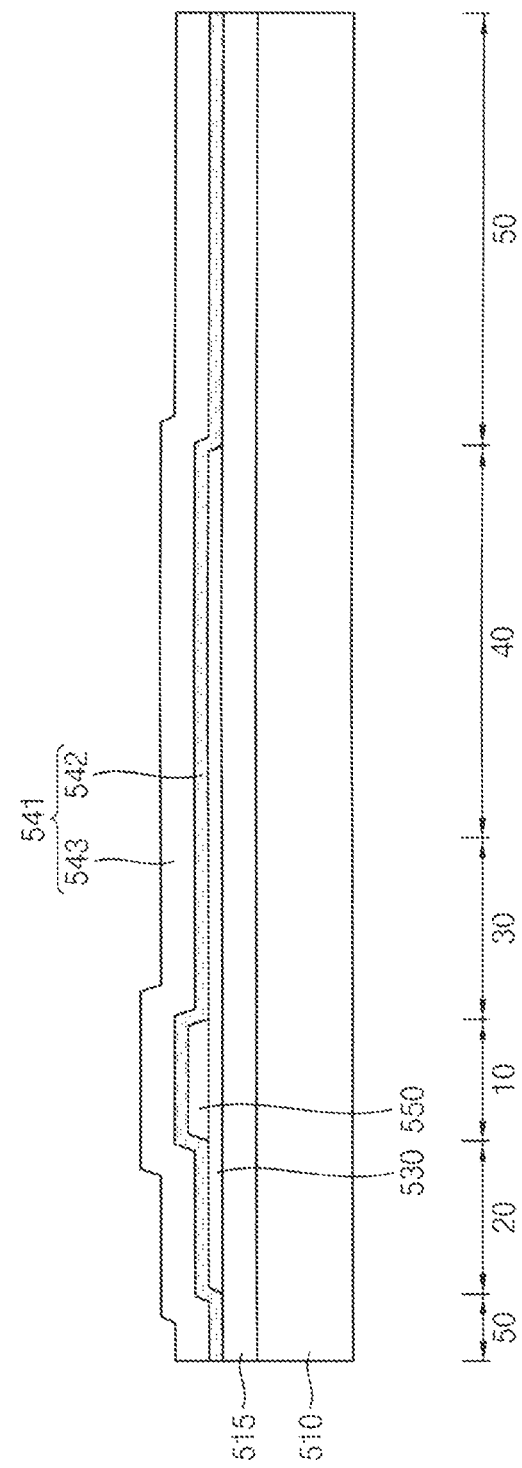

Referring to FIGS. 4 and 5, a metal layer 541 may be formed on the buffer layer 515, the source and drain regions 20 and 30 of the active layer 530, and the gate insulation layer 550. The metal layer 541 may cover the buffer layer 515, the source and drain regions 20 and 30 of the active layer 530, and the gate insulation layer 550 on the substrate 510, and may be formed on the entire substrate 510. For example, the metal layer 541 may cover the buffer layer 515, the source and drain regions 20 and 30 of the active layer 530, and the gate insulation layer 550, and may be formed as a substantially uniform thickness along a profile of the buffer layer 515, the source and drain regions 20 and 30 of the active layer 530, and the gate insulation layer 550.

After the metal layer 541 is formed, a heat treatment process is performed on the substrate 510. In the heat treatment process, the buffer layer 515 may provide oxygen to the metal layer 541 in a portion where the metal layer 541 is in contact with in the buffer layer 515. In example embodiments, the portion where the metal layer 541 is in contact with in the buffer layer 515 may be defined as a contact region 50. That is, the oxygen may be provided in metal layer 541 that is located in the contact region 50. In addition, the source and drain regions 20 and 30 of the active layer 530 may provide oxygen included in the oxide semiconductor layer to the metal layer 541 in a portion where the metal layer 541 is in contact with the source and drain regions 20 and 30 of the active layer 530. Here, In and oxygen may have a weakly bound state, and the oxide semiconductor layer including In may relatively readily provide the oxygen to the metal layer 541. That is, the oxygen may be provided in the metal layer 541 that is located in the source and drain regions 20 and 30 of the active layer 530. In addition, the lower electrode region 40 of the active layer 530 may provide the oxygen included in the oxide semiconductor layer to the metal layer 541 in a portion where the metal layer 541 is in contact with the lower electrode region 40 of the active layer 530. That is, the oxygen may be provided in the metal layer 541 that is located in the lower electrode region 40 of the active layer 530. Meanwhile, the source, drain, and lower electrode regions 20, 30, and 40 of the active layer 530 that provides the oxygen may be metalized. That is, a resistance index of the source, drain, and lower electrode regions 20, 30, and 40 may be relatively less than that of the channel region 10. Further, the gate insulation layer 550 may provide oxygen to the metal layer 541 in a portion where the metal layer 541 is in contact with the gate insulation layer 550. That is, the oxygen may be provided in the metal layer 541 that surrounds the gate insulation layer 550.

In this case, the metal layer 541 that receives the oxygen may convert a portion of the metal layer 541 into a metal oxide insulation layer. For example, as illustrated FIG. 4, the metal layer 541 may be substantially divided into two layers. In other words, the protective insulating layer 540 (illustrated in FIG. 8) may be formed inside the metal layer. A first layer 542 of the metal layer 541 that receives the oxygen from the buffer layer 515, the gate insulation layer 550, the source, drain, and lower electrode regions 20, 30, and 40 of the active layer 530 may be converted into a metal insulation layer, and a second layer 543 that is disposed on the first layer 542 of the metal layer 541 may be the existing metal layer.

In example embodiments, the second layer 543 (for subsequently forming a gate electrode) and the first layer 542 (for subsequently forming the protective insulating layer 540) may have the same material. The first layer 542 may include inorganic materials. For example, the first layer 542 may be formed using at least one of AlOx, TaOx, HfOx, ZrOx, TiOx, etc.

The second layer 543 of the metal layer 541 may include at least one of a metal, a metal alloy, metal nitride, a conductive metal oxide, transparent conductive materials, etc. For example, the second layer 543 may be formed using at least one of Au, Ag, Al, an alloy of aluminum, AlNx, an alloy of silver, W, WNx, Cu, an alloy of copper, Ni, Cr, CrNx, Mo, an alloy of molybdenum, Ti, TiNx, Pt, Ta, TaNx, Nd, Sc, SRO, ZnOx, SnOx, InOx, GaOx, ITO, IZO, etc. These may be used alone or in a suitable combination thereof. In example embodiments, the second layer 543 may include a metal of a high reactivity. For example, the second layer 543 may be formed of Al or Ti. That is, when the second layer 543 is formed of Al, the first layer 542 may be formed of AlOx. In addition, when the second layer 543 is formed of Ti, the first layer 542 may be formed of TiOx.

In embodiments, the metal layer 541 includes a metal of a high reactivity, and the metal layer 541 may be oxidized due to oxygen in the atmosphere. Accordingly, in order to prevent this, the heat treatment process may be performed in a vacuum environment (e.g., inside a vacuum chamber).

Figure 6:
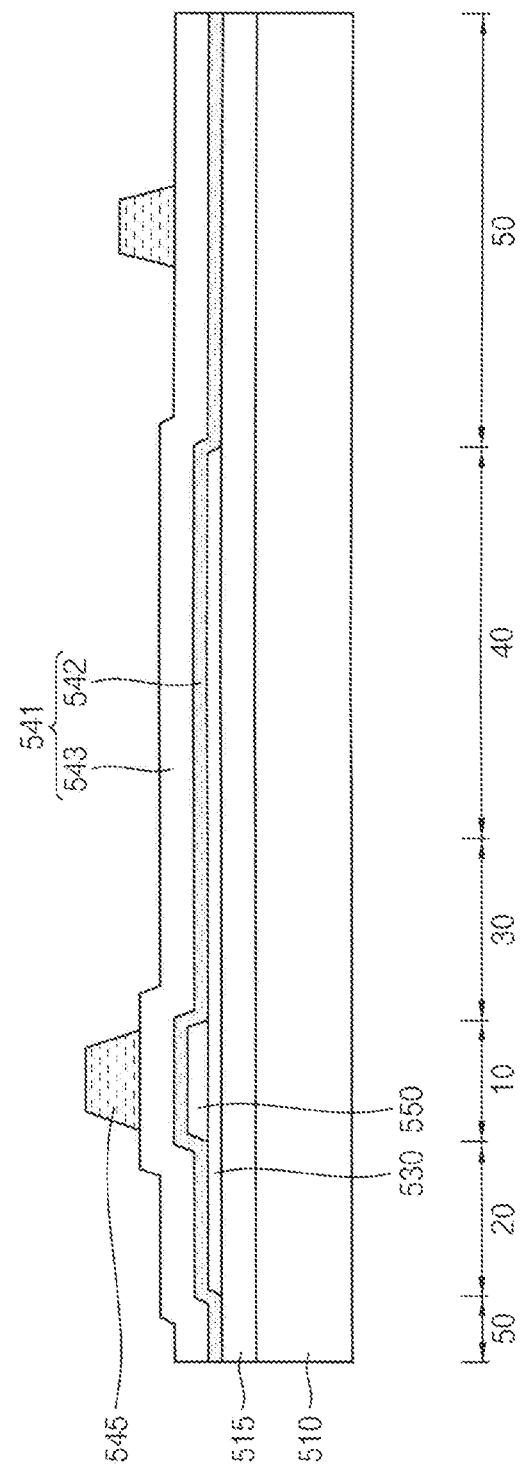
Figure 7:
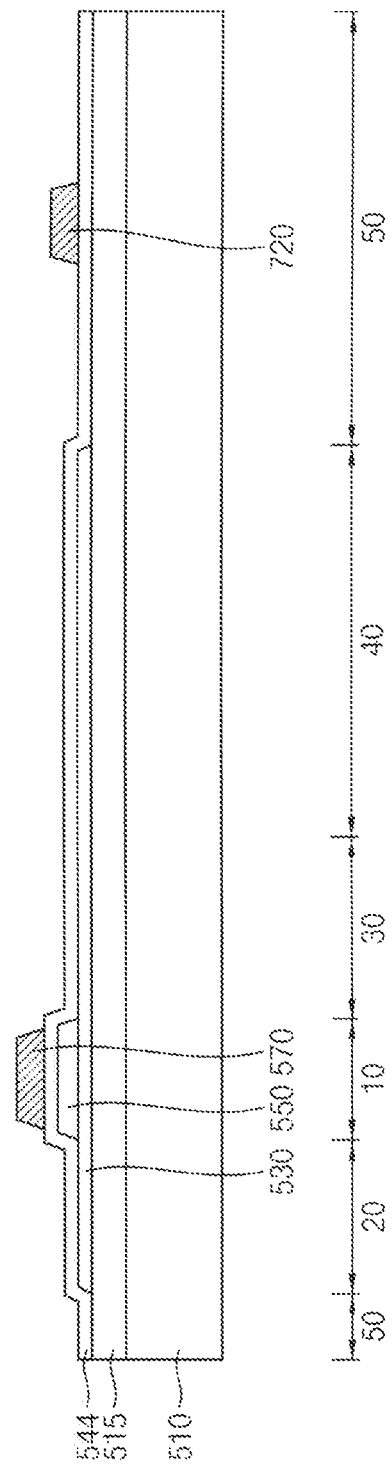

Referring to FIGS. 6 and 7, a first photoresist 545 may be formed on the second layer 543 of the metal layer 541 over the gate insulation layer 550. In addition, a second photoresist 545 may be formed in a portion of the contact region 50. The metal layer 541 may be partially removed using the first and second photoresists 545 as a mask. For example, a selective etching process may be performed in the metal layer 541, as illustrated in FIG. 6 and FIG. 7, the gate electrode 570, the first electrode 720, and a preliminary protective insulating layer 544 may be formed.

Figure 8:
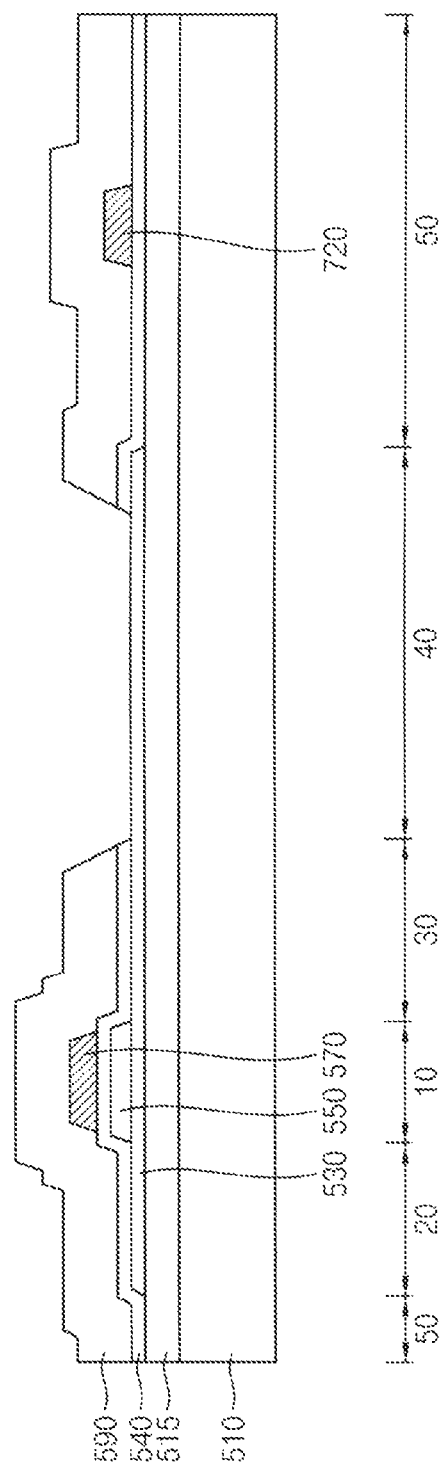

Referring to FIG. 8, an insulating interlayer 590 may be formed on the gate electrode 570, the first electrode 720, and the protective insulating layer 540. For example, a preliminary insulating interlayer may be entirely formed on the gate electrode 570, the first common layer 720, and the preliminary protective insulating layer 544. After the preliminary insulating interlayer is formed, an opening that exposes a portion of the lower electrode region 40 may be formed in the preliminary insulating interlayer. In this process, portion of the preliminary protective insulating layer 544 may be removed such that the preliminary protective insulating layer 544 exposes a portion of the lower electrode region 40. Accordingly, the insulating interlayer 590 and the protective insulating layer 540 may be formed.

The insulating interlayer 590 may cover the gate electrode 570, the first common layer 720, and the protective insulating layer 540 on the substrate 510, and may expose the lower electrode region 40 of the active layer 530. For example, the insulating interlayer 590 may cover the gate electrode 570, the first electrode 720, and the protective insulating layer 540, and may be formed as a substantially uniform thickness along a profile of the gate electrode 570, the first electrode 720, and the protective insulating layer 540. In embodiments, the insulating interlayer 590 may sufficiently cover the gate electrode 570, the first electrode 720, and the protective insulating layer 540, and may have a substantially even surface without a step around the gate electrode 570, the first electrode 720, and the protective insulating layer 540. The insulating interlayer 590 may be formed using organic materials or inorganic materials.

Figure 9:
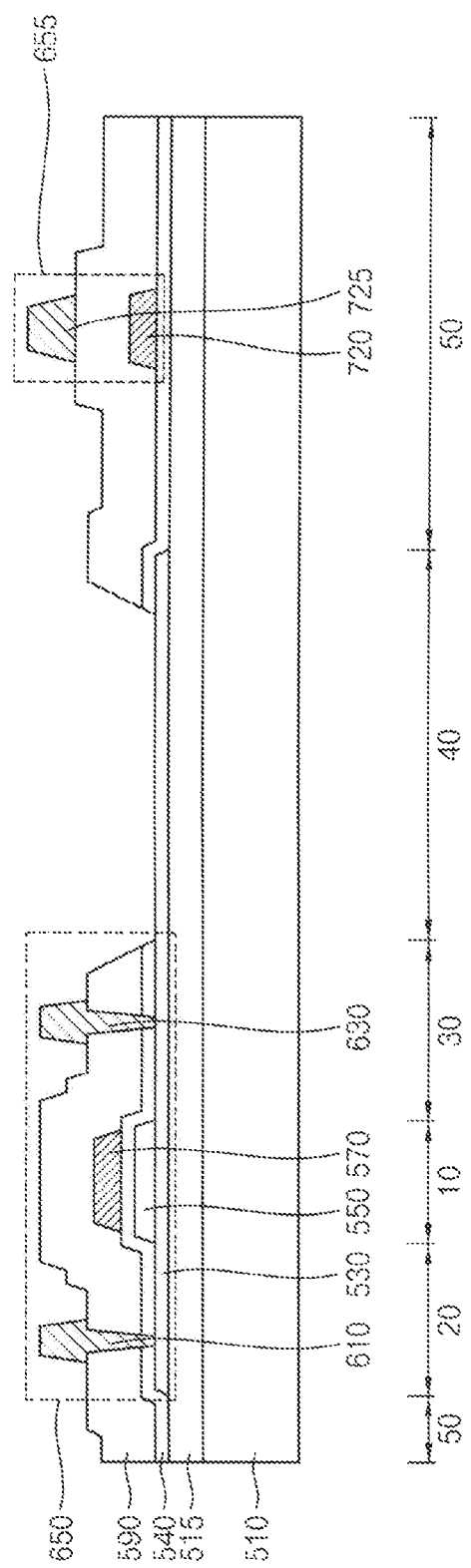

Referring to FIG. 9, a source electrode 610 and a drain electrode 630 may be formed on the source region 20 and the drain region 30, respectively on and through the insulating interlayer 590. The source electrode 610 may be in contact with the source region 20 of the active layer 530 via a contact hole formed by removing a portion of the insulating interlayer 590 and the protective insulating layer 540 each. The drain electrode 630 may be in contact with a drain region 30 of the active layer 530 via a contact hole formed by removing a portion of the insulating interlayer 590 and the protective insulating layer 540 each. Each of the source and drain electrodes 610 and 630 may be formed using a metal, a metal alloy, metal nitride, conductive metal oxide, transparent conductive materials, etc. These may be used alone or in a suitable combination thereof. In embodiments, each of the source and drain electrodes 610 and 630 may have a multi-layered structure. Accordingly, the semiconductor element 650 including the active layer 530, the gate insulation layer 550, the protective insulating layer 540, the gate electrode 570, the insulating interlayer 590, the source electrode 610, and the drain electrode 630 may be formed.

A second electrode 725 may be formed in the contact region 50 on the insulating interlayer 590. The second electrode 725 may be formed over the first electrode 320. The second electrode 725, the source electrode 610, and the drain electrode 630 may be simultaneously formed using the same material. Accordingly, the storage capacitor 655 including the first electrode 720 and the second electrode 725 may be formed.

Figure 10:
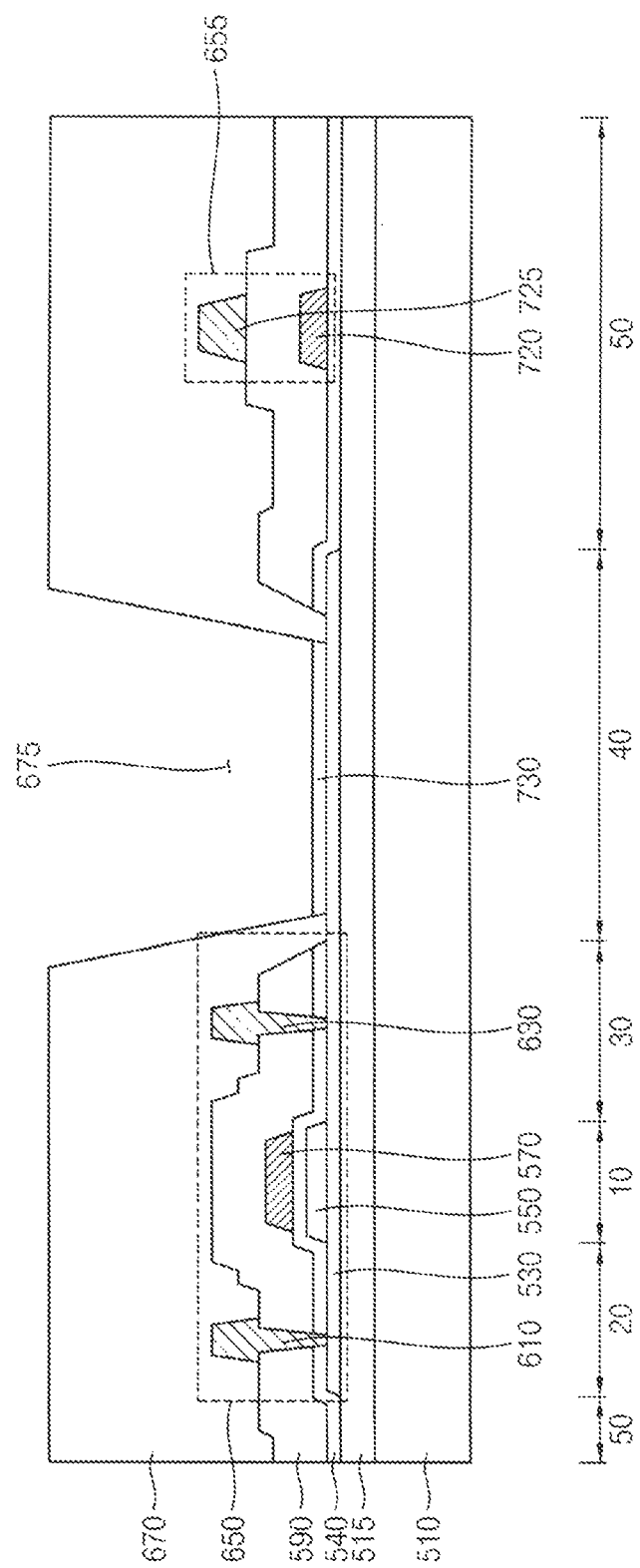

Referring to FIG. 10, a planarization layer 670 may be formed on the insulating interlayer 590, the source and drain electrodes 610, and 630, and the second electrode 725. The planarization layer 670 may cover the insulating interlayer 590, the source and drain electrodes 610, and 630, and the second electrode 725 on the substrate 510, and may have the opening 675 exposing a portion of the lower electrode region 40 of the active layer 530. In example embodiments, the light emitting layer 730 may be formed in the opening 675 of the planarization layer 670, and the planarization layer 670 may serve as a pixel defining layer. For example, the planarization layer 670 may be formed as a relatively high thickness to sufficiently cover the insulating interlayer 590, the source and drain electrodes 610 and 630, and the second electrode 725. In this case, the planarization layer 670 may have a substantially even upper surface, and a planarization process may be further performed on the planarization layer 670 to implement the even upper surface of the planarization layer 670. The planarization layer 670 may be formed using organic materials or inorganic materials.

A light emitting layer 730 may be formed in lower electrode region 40 on an upper surface of the active layer 530 that is exposed by the planarization layer 670. The light emitting layer 730 may have a multi-layered structure including EL, HIL, HTL, ETL, EIL, etc. The EL of the light emitting layer 730 may be formed using at least one of light emitting materials capable of generating light of different colors (e.g., red light, blue light, green light, etc.). In embodiments, the EL of the light emitting layer 730 may generally generate white light by stacking a plurality of light emitting materials capable of generating light of different colors such as red light, green light, blue light, etc. In this case, a color filter may be formed under the light emitting layer 730 (e.g., the color filter may be formed on a lower surface of the substrate 510 or between the substrate 510 and the buffer layer 515). The color filter may include at least one selected from a red color filter, a green color filter, and a blue color filter. In embodiments, the color filter may include a yellow color filter, a cyan color filter, and a magenta color filter. The color filter may be formed using a photosensitive resin, etc.

Figure 11:
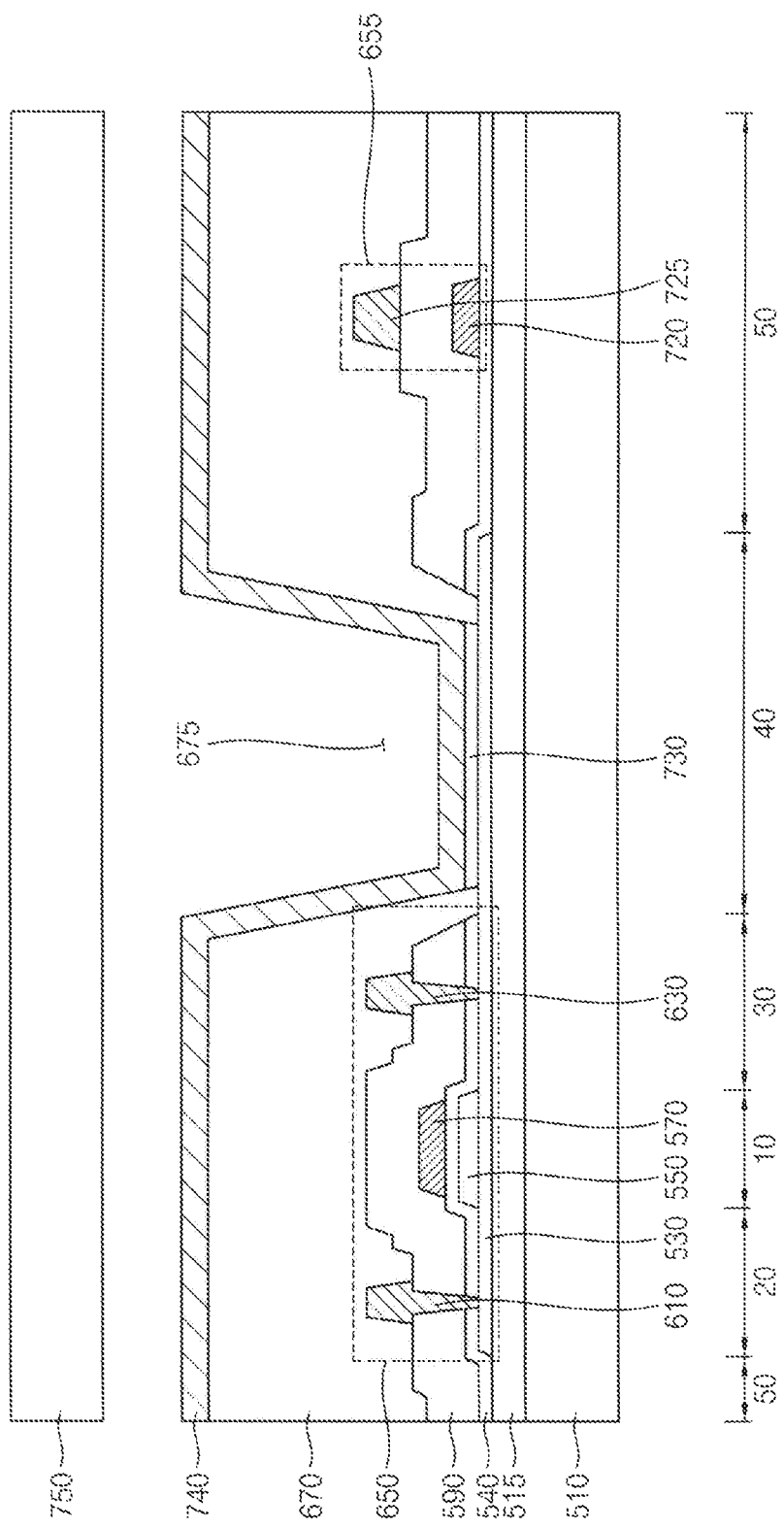

Referring to FIG. 11, an upper electrode 740 may be formed on the planarization layer 670 and the light emitting layer 730. In embodiments, the upper electrode 740 may be formed on the light emitting layer 730 and a portion of the planarization layer 670. The OLED device in the lower electrode region 40 of the active layer 530 may display a displaying image in a direction from the encapsulation substrate 750 into the substrate 510 (e.g., a bottom emission structure). In embodiments, a thickness of the upper electrode 740 may be greater than that of the active layer 530 such that a light emitted from the light emitting layer 730 is reflected from the upper electrode 740 in the direction. In some example embodiments, when a portion of the light emitted from the light emitting layer 730 is reflected from the upper electrode 740 and a remaining portion of the light travels through the upper electrode 740 (e.g., the upper electrode 340 is a transflective electrode), the OLED device may serve as a dual sided OLED device. The upper electrode 740 may be formed using a metal, a metal alloy, metal nitride, conductive metal oxide, etc. These may be used alone or in a suitable combination thereof. In embodiments, the upper electrode 740 may have a multi-layered structure. Accordingly, a sub-pixel structure including the light emitting layer 730 and the upper electrode 740 may be formed.

An encapsulation substrate 750 may be formed on the upper electrode 740. The encapsulation substrate 750 and the substrate 510 may include substantially the same material. For example, the encapsulation substrate 750 may include a quartz substrate, a synthetic quartz substrate, a calcium fluoride substrate, a fluoride-doped quartz substrate, a sodalime glass substrate, a non-alkali glass substrate, etc. In some example embodiments, the encapsulation substrate 750 may include a transparent inorganic material or flexible plastic. For example, the encapsulation substrate 750 may include a flexible transparent resin substrate. In this case, to increase flexibility of the OLED device, the encapsulation substrate 750 may include a stacked structure where at least one inorganic layer and at least one organic layer are alternately stacked. Accordingly, the OLED device 100 illustrated in FIG. 1 may be manufactured.

As a method of manufacturing the OLED device in accordance with example embodiments includes the protective insulating layer 540, and the OLED device may readily protect the active layer 530. In addition, as the gate electrode 570 and the protective insulating layer 540 are simultaneously formed, the number of a mask that is used in a manufacturing process of the OLED device may be reduced. Further, since the lower electrode region 40 of the active layer 530 serves as a lower electrode and the planarization layer 670 serves as a pixel defining layer, the OLED device may not include the lower electrode and the pixel defining layer. Accordingly, the number of a mask that is used in a manufacturing process of the OLED device may be further reduced.

Figure 12:
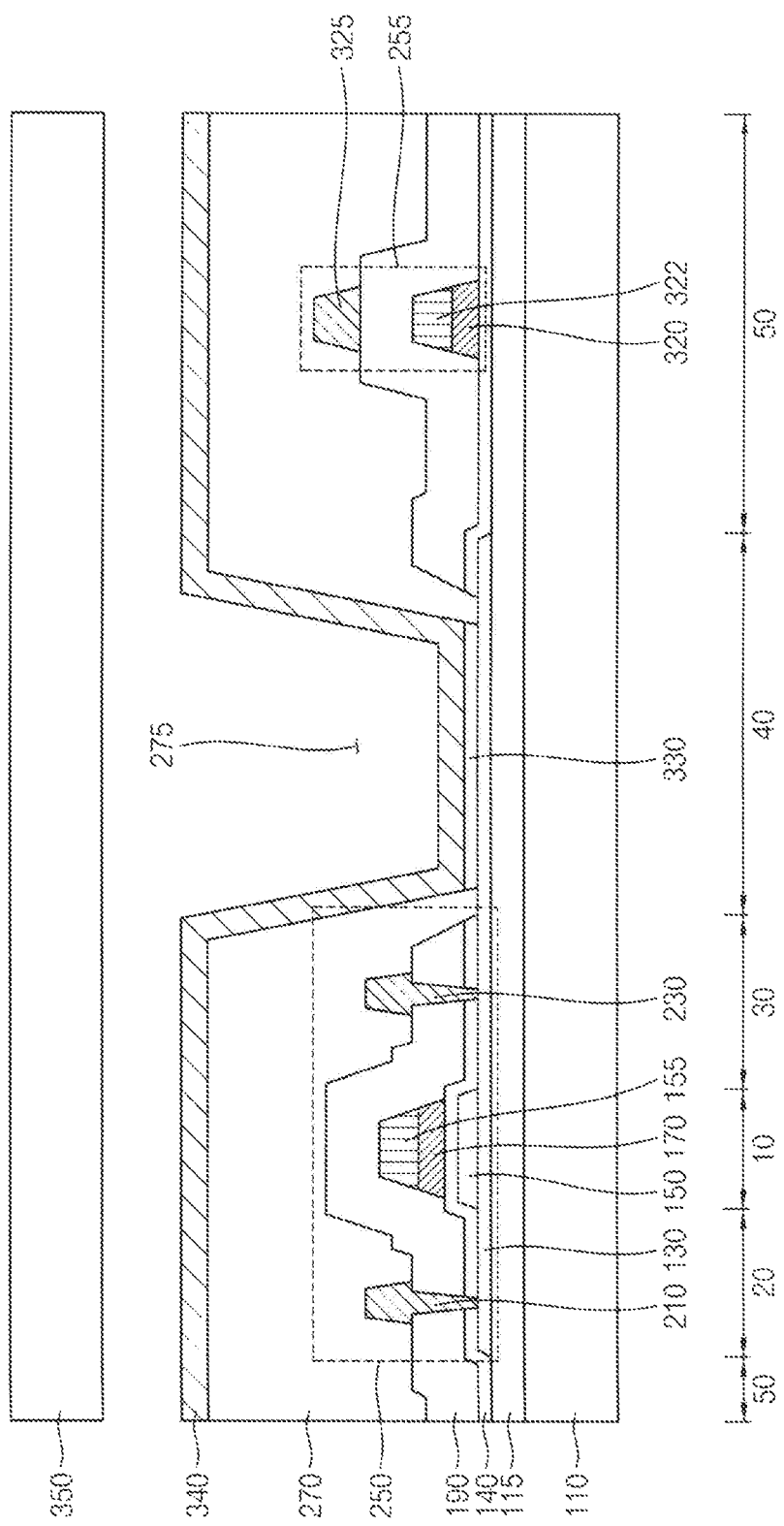
FIG. 12 is a cross-sectional view illustrating an OLED device, in accordance with example embodiments.

FIG. 12 is a cross-sectional view illustrating an OLED device in accordance with example embodiments. An OLED device illustrated in FIG. 12 may have a configuration substantially the same as or similar to that of an OLED device 100 described with reference to FIG. 1 except an auxiliary gate electrode 155 and an auxiliary first electrode 322. In FIG. 12, detailed descriptions for elements that are substantially the same as or similar to elements described with reference to FIG. 1 may not be repeated.

Referring to FIG. 12, an OLED device may include a substrate 110, a buffer layer 115, a semiconductor element 250, a storage capacitor 255, a planarization layer 270, a sub-pixel structure, an encapsulation substrate 350, etc. Here, the semiconductor element 250 may include an active layer 130, a gate insulation layer 150, a protective insulating layer 140, a gate electrode 170, an auxiliary gate electrode 155, an insulating interlayer 190, a source electrode 210, and a drain electrode 230. In example embodiments, the active layer 130 may have a channel region 10, a source region 20, a drain region 30, and a lower electrode region 40. In addition, the storage capacitor 255 may include a first electrode 320, an auxiliary first electrode 322, and a second electrode 325. Further, the sub-pixel structure may include a light emitting layer 330 and an upper electrode 340. Here, a thickness of the upper electrode 340 may be greater than that of the active layer 130, and the upper electrode 340 may reflect a light that is emitted from the light emitting layer 330 in a direction from the encapsulation substrate 350 into substrate 110.

The auxiliary gate electrode 155 may be disposed on the gate electrode 170. When the OLED device 100 becomes larger, a wiring resistance of the gate electrode 170 may be increased. Accordingly, to decrease the wiring resistance of the gate electrode 170, the auxiliary gate electrode 155 may is added. The auxiliary gate electrode 155 may include at least one of a metal, a metal alloy, metal nitride, conductive metal oxides, transparent conductive materials, etc. In example embodiments, the auxiliary gate electrode 155 may be formed of Cu.

The auxiliary first electrode 322 may be disposed on the first electrode 320 of the storage capacitor 255. The auxiliary first electrode 322 may reduce a wiring resistance of the first electrode 320. The auxiliary gate electrode 155 and the auxiliary first electrode 322 may be simultaneously formed using the same material. For example, after the buffer layer 115, the active layer 130, and the gate insulation layer 150 are disposed, a metal layer may be disposed on the buffer layer 115, the active layer 130, and the gate insulation layer 150. In addition, a preliminary auxiliary gate electrode may be disposed on the metal layer. After the metal layer and the preliminary auxiliary gate electrode are disposed, a heat treatment process is performed on the substrate 110, and then the gate electrode 170, the first electrode 320, the auxiliary gate electrode 155, and the auxiliary first electrode 322 may be simultaneously formed by partially removing the metal layer and the preliminary auxiliary gate electrode after the heat treatment process.

Figure 13:
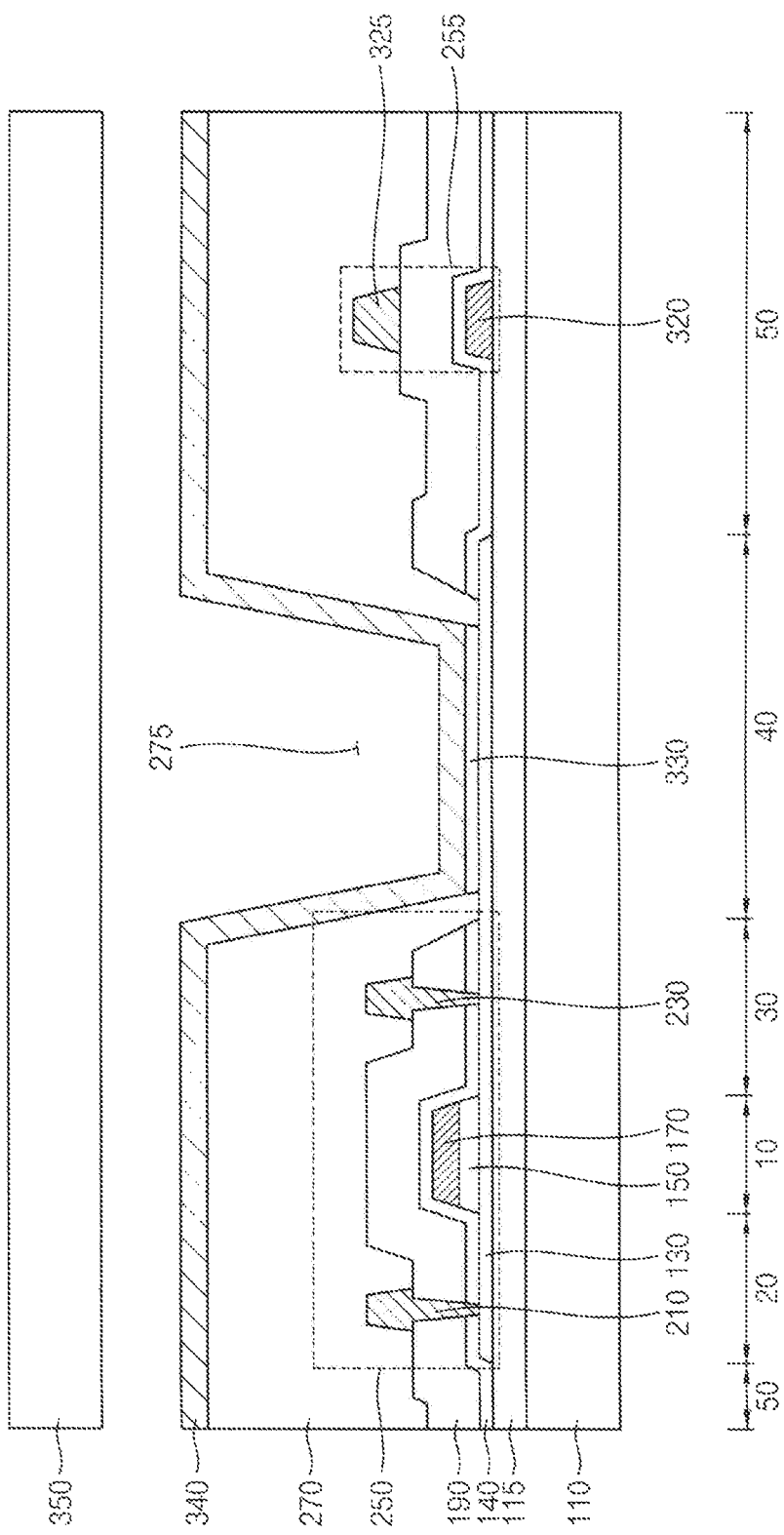
FIG. 13 is a cross-sectional view illustrating an OLED device, in accordance with example embodiments.

FIG. 13 is a cross-sectional view illustrating an OLED device in accordance with example embodiments. An OLED device illustrated in FIG. 13 may have a configuration substantially the same as or similar to that of an OLED device 100 described with reference to FIG. 1 except a shape of the protective insulating layer 140. In FIG. 13, detailed descriptions for elements that are substantially the same as or similar to elements described with reference to FIG. 1 may not be repeated.

Referring to FIG. 13, a protective insulating layer 140 may be disposed on a buffer layer 115, source and drain regions 20 and 30 of an active layer 130, and a gate electrode 170. In this structure, the gate insulation layer 150 may be formed using the gate electrode 170 as a mask. For example, a preliminary gate electrode layer and a preliminary gate insulation layer may be disposed on the buffer layer 115.

After a photoresist is disposed on the preliminary gate insulation layer that is located in a channel region 10, the preliminary gate electrode layer may be partially removed using the photoresist as a mask. In this way, the gate electrode 170 of FIG. 13 may be formed. After the gate electrode 170 is formed, the preliminary gate insulation layer may be partially removed using the gate electrode 170 as a mask. In this way, the gate insulation layer 150 of FIG. 13 maybe formed. Accordingly, the number of a mask that is used in a manufacturing process of the OLED device may be decreased.

Embodiments may be applied to various display devices including an organic light emitting display device. For example, embodiments may be applied to one or more of a vehicle-display device, a ship-display device, an aircraft-display device, portable communication devices, display devices for display or for information transfer, a medical-display device, etc.

The foregoing is illustrative of example embodiments and is not to be construed as limiting thereof. Although a few example embodiments have been described, those skilled in the art will readily appreciate that many modifications are possible in the example embodiments without materially departing from the novel teachings and advantages of the present inventive concept. All such modifications are intended to be included within the scope defined in the claims.

What is claimed is:

1. An organic light emitting display (OLED) device, comprising:
   a substrate;
   a buffer layer on the substrate;
   an active layer directly on a face of the buffer layer, the active layer having a source region, a drain region, and a channel region;
   a gate insulation layer overlapping the channel region of the active layer;
   a storage capacitor comprising a capacitor electrode;
   a light blocking member;
   a protective insulating layer formed of a first material and overlapping each of the buffer layer, the source region of the active layer, the drain region of the active layer, and the gate insulation layer, wherein a section of the protective insulating layer is positioned between two opposite edges of the capacitor electrode, is positioned between the capacitor electrode and the light blocking member, overlaps the light blocking member, and directly contacts the face of the buffer layer;
   a gate electrode overlapping the channel region;
   an insulating interlayer formed of a second material different from the first material and directly contacting the gate electrode;
   source and drain electrodes directly contacting the insulating interlayer, the source and drain electrodes being in contact with the source and drain regions of the active layer, wherein a portion of the second material of the insulating interlayer continuously extends from the gate electrode to at least one of the source and drain electrodes;
   a light emitting layer;
   an electrode overlapping the light emitting layer; and
   a planarization layer directly contacting each of the active layer, the protective insulating layer, the insulating interlayer, the light emitting layer, and the electrode.

2. The OLED device of claim 1, wherein the buffer layer and the gate insulation layer include inorganic materials having oxygen.

3. The OLED device of claim 1, wherein the buffer layer and the gate insulation layer consists essentially of inorganic materials having oxygen.

4. The OLED device of claim 1, wherein the active layer includes oxide semiconductor.

5. The OLED device of claim 1, wherein the capacitor electrode is spaced from the gate electrode and directly contacts the protective insulating layer, and wherein the protective insulating layer and the capacitor electrode have the same metal material.

6. The OLED device of claim 1, further comprising:
   an auxiliary gate electrode disposed on the gate electrode, wherein the auxiliary gate electrode is disposed between the gate electrode and the insulating interlayer.

7. The OLED device of claim 1, further comprising:
   a lower electrode positioned between the substrate and the light emitting layer.

8. The OLED device of claim 7, wherein the active layer extends in a direction from the channel region to the drain region, and an extended portion of the active layer is defined as a lower electrode region, and
   wherein the extended portion of the active layer serves as the lower electrode, and the protective insulating layer and the insulating interlayer expose the lower electrode region of the active layer.

9. The OLED device of claim 1,
   wherein two edges of the planarization layer directly contact the active layer, and
   wherein an edge of the light blocking member is disposed between the two edges of the planarization layer.

10. An OLED device, comprising:
    a substrate;
    a buffer layer on the substrate;
    an active layer directly on a face of the buffer layer, the active layer having a source region, a drain region, and a channel region;
    a gate insulation layer overlapping the channel region of the active layer;
    a gate electrode on the gate insulation layer;
    a storage capacitor comprising a capacitor electrode directly on the face of the buffer layer, wherein every material of the capacitor electrode is identical to a material of the gate electrode;
    a protective insulating layer formed of a same insulating material directly on all of the buffer layer, the source region of the active layer, the drain region of the active layer, and the gate electrode;
    an insulating interlayer directly on the protective insulating layer;
    source and drain electrodes on the insulating interlayer, the source and drain electrodes being in contact with the source and drain regions of the active layer; and
    a light emitting layer positioned closer to the active layer than the insulating interlayer and spaced from each of the protective insulating layer and the insulating interlayer by a gap, wherein the light emitting layer and the protective insulating layer respectively define two opposite edges of the gap, and wherein the gap partially exposes the active layer.

11. The OLED device of claim 10, wherein each material of the capacitor electrode is different from every material of the active layer.

12. The OLED device of claim 10, wherein a metal material of the protective insulating layer is identical to a metal material of the gate electrode.

* * * * *